(12) United States Patent
Yun et al.

(10) Patent No.: US 11,462,714 B2
(45) Date of Patent: Oct. 4, 2022

(54) ORGANIC LIGHT EMITTING DIODE DISPLAY DEVICE

(71) Applicant: LG Display Co., Ltd., Seoul (KR)

(72) Inventors: Jeong-Gi Yun, Gimpo-si (KR); Kyoung-Jin Nam, Paju-si (KR); Young-Wook Lee, Goyang-si (KR); Jong-Han Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/656,464

(22) Filed: Oct. 17, 2019

(65) Prior Publication Data

US 2020/0127231 A1 Apr. 23, 2020

(30) Foreign Application Priority Data

Oct. 19, 2018 (KR) .......................... 10-2018-0125211

(51) Int. Cl.
*H01L 51/52* (2006.01)
*H01L 27/32* (2006.01)

(52) U.S. Cl.
CPC ........ *H01L 51/5253* (2013.01); *H01L 27/323* (2013.01); *H01L 27/3258* (2013.01); *H01L 27/3234* (2013.01)

(58) Field of Classification Search
CPC ................ H01L 27/323; H01L 27/3244–3246
See application file for complete search history.

(56) References Cited

U.S. PATENT DOCUMENTS

| 9,632,487 B2* | 4/2017 | Kim ..................... H01L 27/3258 |
| 2019/0131379 A1* | 5/2019 | Won ..................... H01L 27/3276 |
| 2020/0185466 A1* | 6/2020 | Xiang ................. H01L 27/3258 |
| 2020/0225535 A1* | 7/2020 | Wang ................. H01L 27/3234 |

* cited by examiner

*Primary Examiner* — Suberr L Chi
(74) *Attorney, Agent, or Firm* — Seed IP Law Group LLP (57) ABSTRACT

A display device capable of reducing a non-display area is disclosed. The disclosed display device includes a first through hole not overlapping with an organic cover layer surrounding at least one hole area disposed within an active area, and a second through hole passing through a substrate. Accordingly, it is possible to minimize a bezel area, which is a non-display area, and to prevent damage to a light emitting stack caused by a stripping process.

13 Claims, 12 Drawing Sheets

ORGANIC LIGHT EMITTING DIODE DISPLAY DEVICE

CROSS-REFERENCE TO RELATED APPLICATION

This application claims the benefit of Korean Patent Application No. 10-2018-0125211 filed on Oct. 19, 2018, which is hereby incorporated by reference as if fully set forth herein.

BACKGROUND

Technical Field

The present disclosure relates to a display device, and more particularly to a display device capable of reducing a non-display area.

Description of the Related Art

An image display device, which renders a variety of information on a screen, is a core technology of the information age. Such an image display device is developing towards enhanced thinness, enhanced lightness, and enhanced portability as well as enhanced performance. In connection with this, a slim display device capable of eliminating disadvantages of heavy and bulky structures of cathode ray tubes (CRTs) is highlighted.

Representative examples of such a slim display device may include a liquid crystal display (LCD) device, a plasma display panel (PDP), an organic light emitting display (OLED) device, an electrophoretic display (ED) device, and the like.

Such a slim display device is employed in various types of appliances such as a television (TV), a monitor and a portable phone, and is being further advanced through addition of a camera, a speaker and a sensor thereto. However, the camera, the speaker, the sensor and the like are disposed in a non-display area of the display device and, as such, a bezel area, which is a non-display area, increases. For this reason, conventional display devices have a problem in that a display area is reduced.

BRIEF SUMMARY

Accordingly, the present disclosure is directed to a display device that substantially obviates one or more problems due to limitations and disadvantages of the related art.

Various embodiments of the present disclosure provide a display device capable of reducing a non-display area.

Additional advantages and features of the disclosure will be set forth in part in the description which follows and in part will become apparent to those having ordinary skill in the art upon examination of the following or may be learned from practice of the various embodiments of the present disclosure. Other advantages of the various embodiments of the present disclosure may be realized and attained by the structure particularly pointed out in the written description and claims hereof as well as the appended drawings.

According to one embodiment, a display device includes a first through hole not overlapping with an organic cover layer surrounding at least one hole area disposed within an active area, and a second through hole passing through a substrate. Accordingly, it may be possible to minimize a bezel area, which is a non-display area, and to prevent damage to a light emitting stack caused by a stripping process.

It is to be understood that both the foregoing general description and the following detailed description of the various embodiments of the present disclosure are exemplary and explanatory and are intended to provide further explanation of the various embodiments of the present disclosure as claimed.

BRIEF DESCRIPTION OF THE DRAWINGS

The accompanying drawings, which are included to provide a further understanding of the various embodiments of the present disclosure and are incorporated in and constitute a part of this application, illustrate embodiment(s) of the present disclosure and along with the description serve to explain the principle of the various embodiments of the present disclosure. In the drawings.

DETAILED DESCRIPTION

Hereinafter, embodiments of the present disclosure will be described in detail with reference to the accompanying drawings.

Figure 1:
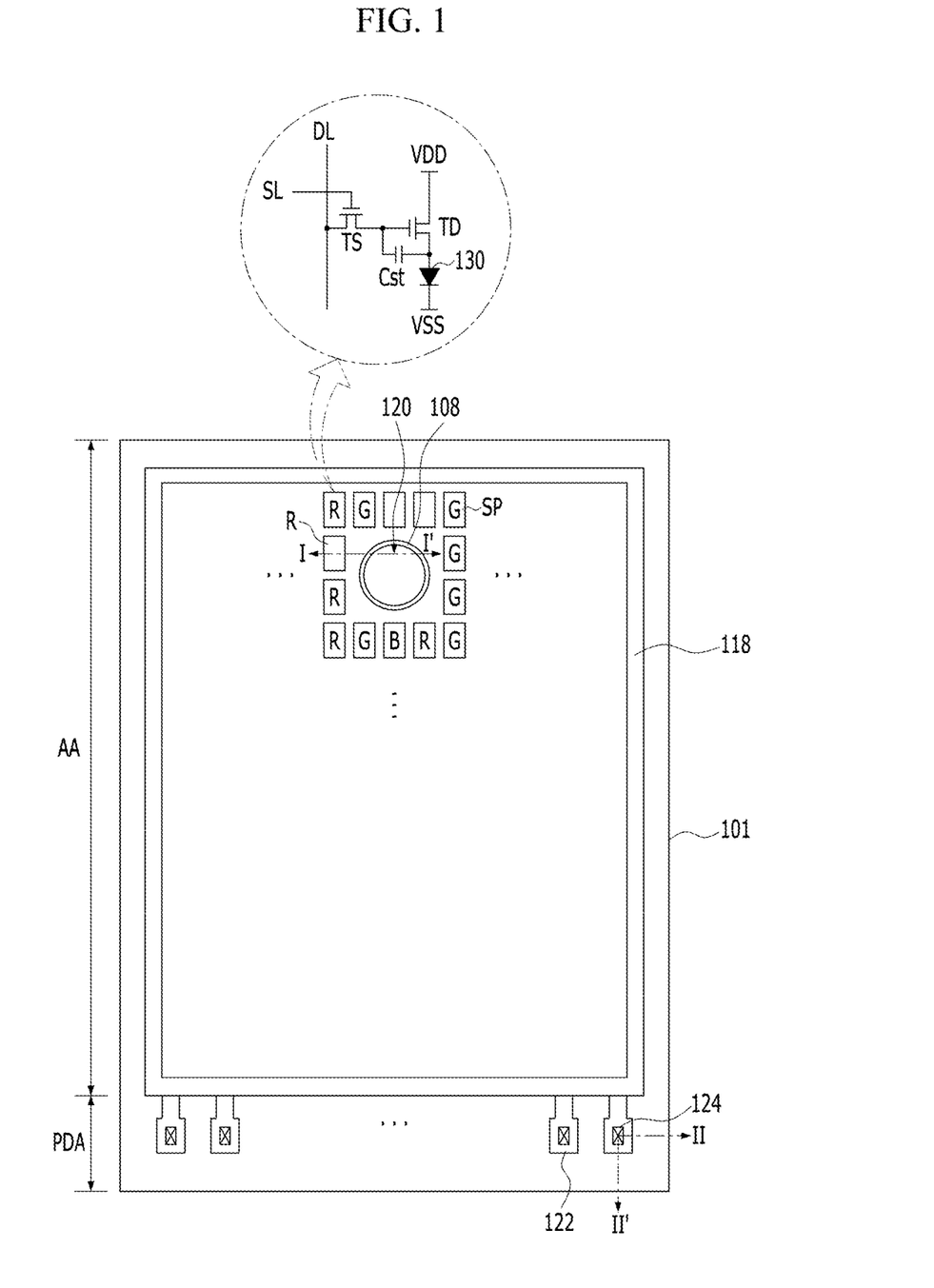
FIG. 1 is a view illustrating an organic light emitting display device according to an embodiment of the present disclosure.
Figure 2:
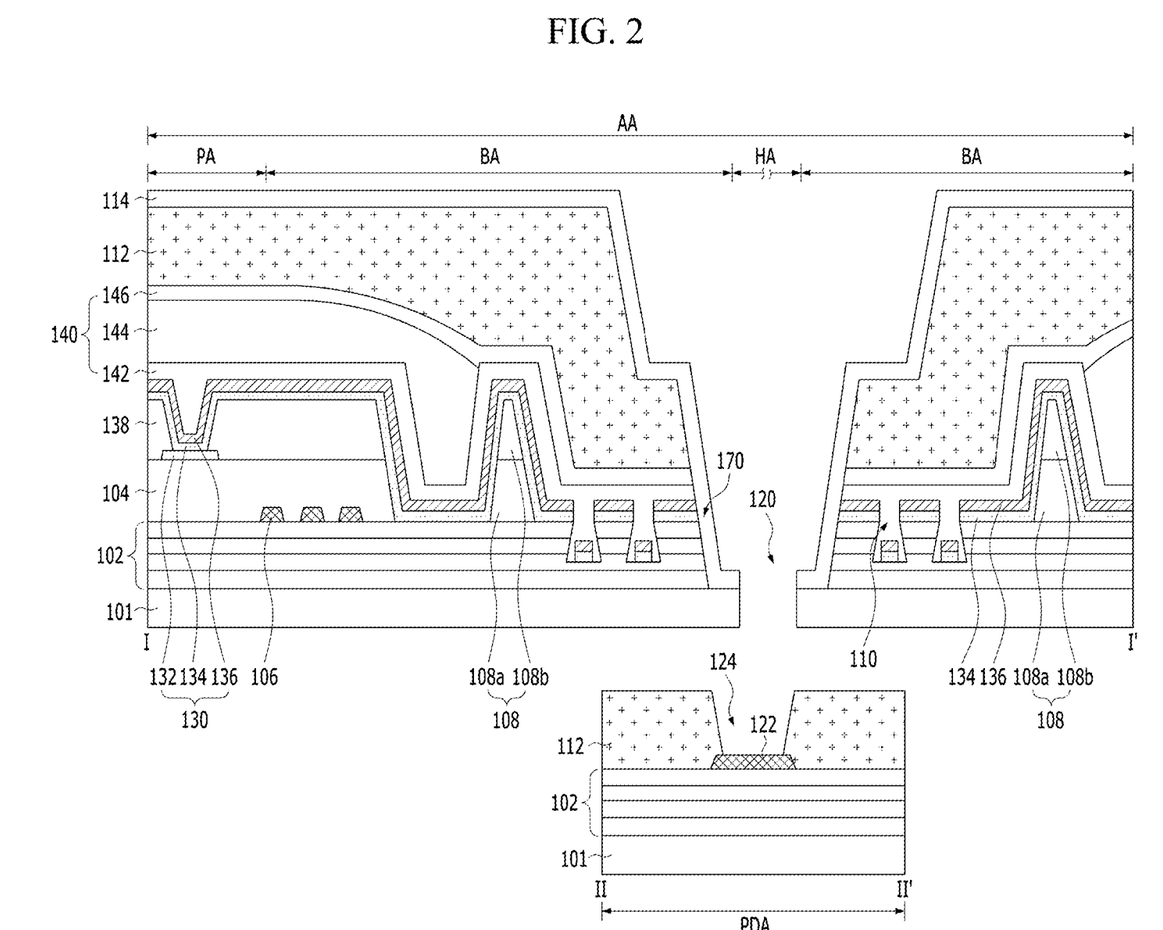
FIG. 2 is a cross-sectional view taken along lines I-I and II-II of FIG. 1, illustrating the organic light emitting display device, which has a structure according to an embodiment of the present disclosure.

Referring to FIGS. 1 and 2, a display device is illustrated. The display device includes an active area AA and a pad area PDA.

As illustrated in FIGS. 1 and 2, the pad area PDA is formed with a plurality of pads 122 to supply drive signals to a plurality of signal lines 106 disposed in the active area AA, respectively. Each signal line 106 includes at least one of a scan line SL, a data line DL, a high-voltage (VDD) supply line or a low-voltage (VSS) supply line.

Each pad 122 is made of the same material as a corresponding one of the signal lines 106 each including at least one of the scan line SL, the data line DL, the high-voltage (VDD) supply line or the low-voltage (VSS) supply line disposed in the active area AA, while being disposed on the same layer as the corresponding signal line 106. Each pad 122 is exposed through a pad contact hole 124 passing or extending through an organic cover layer 112, to contact a signal transmission film (not shown) connected to a driving circuit (not shown).

The active area AA includes pixel areas PA, a bezel area BA and a hole area HA.

Unit pixels, each of which includes a light emitting element 130, are disposed in the pixel areas PA, respectively. Each unit pixel may be constituted by red (R), green (G) and blue (B) subpixels, as illustrated in FIG. 1, or may be constituted by red (R), green (G), blue (B) and white (W) subpixels. Each subpixel includes one light emitting element 130, and a pixel driving circuit for independently driving the light emitting element 130.

The pixel driving circuit includes a switching transistor TS, a driving transistor TD and a storage capacitor Cst.

The switching transistor TS turns on when a scan pulse is supplied to a corresponding scan line SL. In this state, a data signal supplied to a corresponding data line DL is supplied to the capacitor Cst and a gate electrode of the driving transistor TD via the switching transistor TS.

The driving transistor TD controls current I supplied from a corresponding high-voltage (VDD) supply line to the light emitting element 130, in response to the data signal supplied to the gate electrode thereof, thereby adjusting the amount of light emitted from the light emission element 130. Even when the switching transistor TS turns off, the driving transistor TD supplies constant current I by a voltage charged in the storage capacitor Cst until a data signal of a next frame is supplied and, as such, the light emission element 130 maintains emission of light.

The light emitting element 130 includes an anode 132 connected to the drain electrode of the driving transistor TD, at least one light emitting stack 134 formed on the anode 132, and a cathode 136 formed on the light emitting stack 134, to be connected to a low-voltage (VSS) supply line. Here, the low-voltage (VSS) supply line supplies a voltage lower than a high voltage supplied through a high-voltage (VDD) supply line.

The anode 132 is disposed on a planarization layer 104 without being covered by a bank 138 such that the anode 132 is exposed. When the anode 132 as described above is applied to a bottom emission type organic light emitting display device, the anode 132 is constituted by a transparent conductive film made of indium tin oxide (ITO) or indium zinc oxide (IZO). On the other hand, when the anode 132 is applied to a top emission type organic light emitting display device, the anode 132 is formed to have a multilayer structure including a transparent conductive film and an opaque conductive film having high reflection efficiency. The transparent conductive film is made of a material having a relatively high work function, for example, indium tin oxide (ITO) or indium zinc oxide (IZO). The opaque conductive film is formed to have a single-layer structure or a multilayer structure including Al, Ag, Cu, Pb, Mo, Ti or an alloy thereof. For example, the anode 132 is formed to have a structure in which a transparent conductive film, an opaque conductive film and a transparent conductive film are sequentially laminated.

The light emitting stack 134 is formed by laminating a hole transport layer, a light emitting layer and an electron transport layer on the anode 132 in this order or in reverse order.

The cathode 136 is formed on upper surfaces and side surfaces of the light emitting stack 134 and the bank 138, to face the anode 132 under the condition that the light emitting stack 134 is interposed between the anode 132 and the cathode 136.

An encapsulation unit 140 is formed to prevent penetration of external moisture or oxygen into the light emitting element 130, which is weak against moisture or oxygen. To this end, the encapsulation unit 140 includes a plurality of inorganic encapsulation layers 142 and 146, and an organic encapsulation layer 144 disposed between adjacent ones of the inorganic encapsulation layers 142 and 146. The inorganic encapsulation layer 146 is disposed at an uppermost position of the encapsulation unit 140. In this case, the encapsulation unit 140 includes at least one inorganic encapsulation layer 142 or 146 and at least one organic layer 144. The following description will be given in conjunction with an example in which the encapsulation unit 140 has a structure including first and second inorganic encapsulation layers 142 and 146, and one organic encapsulation layer 144 disposed between the first and second inorganic encapsulation layers 142 and 146.

The first inorganic encapsulation layer 142 is formed on the substrate 101 formed with the cathode 136 such that the first inorganic encapsulation layer 142 is disposed most adjacent to the light emitting element 130. The first inorganic encapsulation layer 142 is made of an inorganic insulating material capable of being deposited at low temperature, for example, silicon nitride ($SiN_x$), silicon oxide ($SiO_x$), silicon oxynitride (SiON) or aluminum oxide ($Al_2O_3$). As such, the inorganic encapsulation layer 142 may be deposited in a low-temperature atmosphere. Accordingly, it may be possible to prevent damage to the light emitting stack 134, which is weak in a high-temperature atmosphere during deposition of the first inorganic encapsulation layer 142.

The second inorganic encapsulation layer 146 is formed to cover upper and side surfaces of the organic encapsulation layer 144 and an exposed upper surface of the first inorganic encapsulation layer 142 not covered by the organic encapsulation layer 144. As a result, upper and lower surfaces of the organic encapsulation layer 144 are sealed by the first and second inorganic encapsulation layers 142 and 146 and, as such, it may be possible to minimize or prevent penetration of external moisture or oxygen into the organic encapsulation layer 144 or penetration of moisture or oxygen present within the organic encapsulation layer 144 into the light emitting element 130. The second inorganic encapsulation layer 146 is made of an inorganic insulating material such as silicon nitride ($SiN_x$), silicon oxide ($SiO_x$), silicon oxynitride (SiON) or aluminum oxide ($Al_2O_3$).

The organic encapsulation layer 144 serves as a buffer to buffer stress generated among layers during bending of the organic light emitting display device while enhancing planarization performance. The organic encapsulation layer 144 is made of an organic insulating material such as acryl resin, epoxy resin, polyimide, polyethylene or silicon oxycarbide (SiOC).

Upon formation of the organic encapsulation layer 144, an outer dam 118 and an inner dam 108 are formed in order to restrict flowability of the organic encapsulation layer 144.

As illustrated in FIG. 1, at least one outer dam 118 may be formed to completely surround the active area AA where light emitting elements 130 are disposed or may be formed in an area between the active area AA and the pad area PDA. When a pad area PDA formed with pad electrodes designated by reference numeral "122" is disposed at one side of the substrate 101, the outer dam 128 is disposed at one side of the substrate 101. On the other hand, when pad areas PDA each formed with pad electrodes 122 are disposed at opposite sides of the substrate 101, respectively, outer dams 118 are disposed at the opposite sides of the substrate 101, respectively. When plural outer dams 128 are disposed, the outer dams 128 are disposed in parallel while being spaced apart from one another by a certain distance. By virtue of such an outer dam 128, it may be possible to prevent diffusion of the organic encapsulation layer 144 into the pad area PDA.

At least one inner dam 108 is disposed to completely surround a second through hole 120 disposed in the hole area HA. When plural inner dams 108 are disposed, the inner dams 108 are disposed in parallel while being spaced apart from one another by a certain distance. Such an inner dam 108 is formed to have a single-layer structure or a multilayer structure including layers 108a and 108b, similarly to the outer dam 118. For example, each of the inner dam 108 and the outer dam 118 is formed concurrently with at least one of the planarization layer 104, the bank 128 or a spacer (not shown), using the same material, and, as such, use of an additional mask process and an increase in costs may be prevented. By virtue of such an inner dam 108, the organic encapsulation layer 144, which may function as a moisture penetration path, may be prevented from being diffused into the hole area HA.

The bezel BA is disposed between the hole area HA and the pixel areas PA disposed adjacent to the hole area HA. In the bezel area BA, the above-described inner dam 108, at least one blocking groove 110, the organic cover layer 112, an inorganic cover layer 114 and a first through hole 170 are disposed.

The blocking groove 110 is formed to pass through an inorganic insulating layer 102 including at least one of a multi-buffer layer, an active buffer layer, a gate insulating film, an interlayer insulating film or a passivation film disposed between the substrate 101 and the planarization layer 104. In this case, side surfaces of the inorganic insulating layer 102 exposed through the blocking groove 110 are formed to have a reversed taper shape such that the side surfaces form an acute angle or a right angle with respect to a lower surface of the inorganic insulating layer 102 exposed through the blocking groove 110. By virtue of such a blocking groove 110, each of the light emitting stack 134 and the cathode 136 is disconnected without having continuance during formation thereof. Accordingly, even when external moisture penetrates along the light emitting stack 134 disposed near the hole area HA, introduction of the penetrated moisture into the pixel area PA may be prevented or delayed by the blocking groove 110. In addition, even when static electricity is introduced along the cathode 136 disposed near the hole area HA, diffusion of the introduced static electricity into the pixel area PA may be prevented by the blocking groove 110. Furthermore, the blocking groove 110 exhibits great hardness, as compared to organic insulating materials, and, as such, it may be possible to prevent propagation of cracks into the emission area EA through removal of the inorganic insulating layer 102, which may easily generate cracks when subjected to bending stress.

The organic cover layer 112 is formed on the encapsulation unit 140, using a photosensitive insulating material, and, as such, a separate stripping process is unnecessary upon formation of the organic cover layer 112. For example, the organic cover layer 112 is made of a photoacryl material.

As illustrated in FIG. 2, the organic cover layer 112 is disposed on the inorganic encapsulation layer 146 such that side surfaces of plural thin film layers exposed through the first through hole 170 are maintained in an exposed state. For example, the plural thin film layers include at least one of the inorganic insulating layer 102, the light emitting stack 134, the cathode 136 or the inorganic encapsulation layer 142 or 146. In this case, the organic cover layer 112 does not contact the light emitting stack 134 and, as such, it may be possible to prevent penetration of moisture into the light emitting stack 134 via the organic cover layer 112.

Figure 3A:
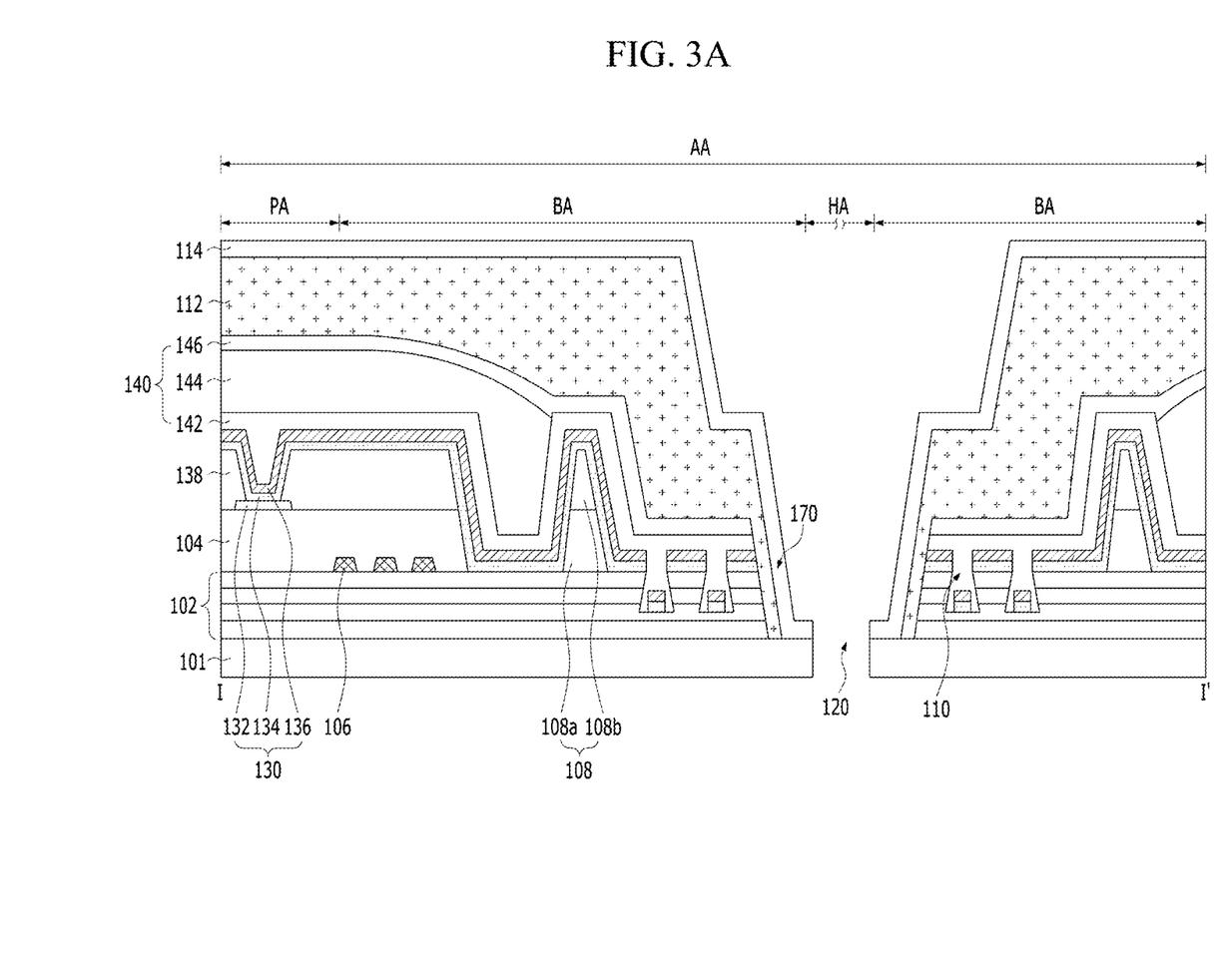
FIGS. 3A and 3B are cross-sectional views illustrating different embodiments of an organic cover layer illustrated in FIG. 2, respectively.

In addition, the organic cover layer 112 is disposed on side and upper surfaces of the inorganic encapsulation layer 146, to cover side surfaces of the plural thin film layers 102, 134, 136, 142 and 146 exposed through the first through hole 170, as illustrated in FIG. 3A. In this case, the organic cover layer 112 illustrated in FIG. 3A protects the light emitting stack 134 because the organic cover layer 112 is formed to cover side surfaces of the light emitting stack 134.

Figure 3B:
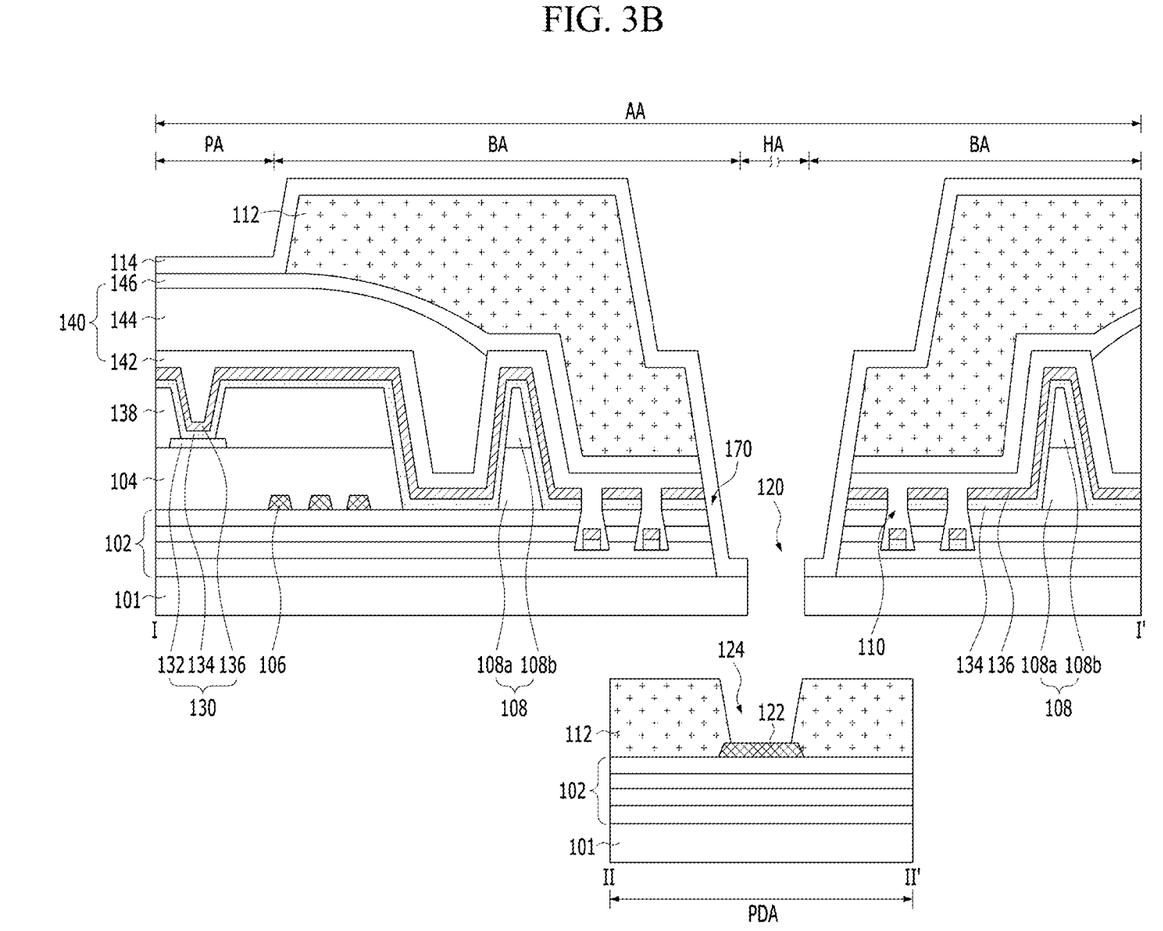

As illustrated in FIG. 3A, the organic cover layer 112 may be formed in areas PA, BA and PDA except for the hole area HA, or may be formed in the bezel area BA and the pad area PDA. In this case, the organic cover layer 112 illustrated in FIGS. 2, 3A and 3B is formed to enclose the hole area HA and, as such, overlaps with at least one of the blocking groove 110 or the inner dam 108.

The inorganic cover layer 114 is formed on the organic cover layer 112, using an inorganic insulating material. The inorganic cover layer 114 is disposed on upper and side surfaces of the organic cover layer 112 disposed in the active area AA. The organic cover layer 112 and interfaces among the thin films 112, 146, 142, 136, 134, 102 and 101 are sealed by the inorganic cover layer 114 and, as such, it may be possible to minimize or prevent penetration of external moisture or oxygen into the organic cover layer 112 and the interfaces.

The first through hole 170 is formed not to overlap with the organic cover layer 112 while passing or extending through the plural thin film layers disposed between the substrate 101 and the organic cover layer 112. For example, the first through hole 170 is formed to pass through portions of the inorganic insulating layer 102, the light emitting stack 134, the cathode 136 and the inorganic encapsulation layers 142 and 146 disposed in the hole area HA and the area disposed therearound, thereby exposing the upper surface of the substrate 101. In this case, the first through hole 170 is formed through a dry etching process using the organic cover layer 112 as a mask. By virtue of the first through hole 170, portions of the inorganic insulating layer 102, the light emitting stack 134, the inorganic encapsulation layers 142 and 146, etc., disposed in the hole area HA are removed and, as such, simplification of a laser trimming process may be achieved.

Since the hole area HA is disposed within the active area AA, the hole area HA may be surrounded by a plurality of subpixels SP disposed in the active area AA. Although the hole area HA is illustrated as having a circular shape, the hole area HA may be formed to have a polygonal shape or an oval shape.

Figure 4:
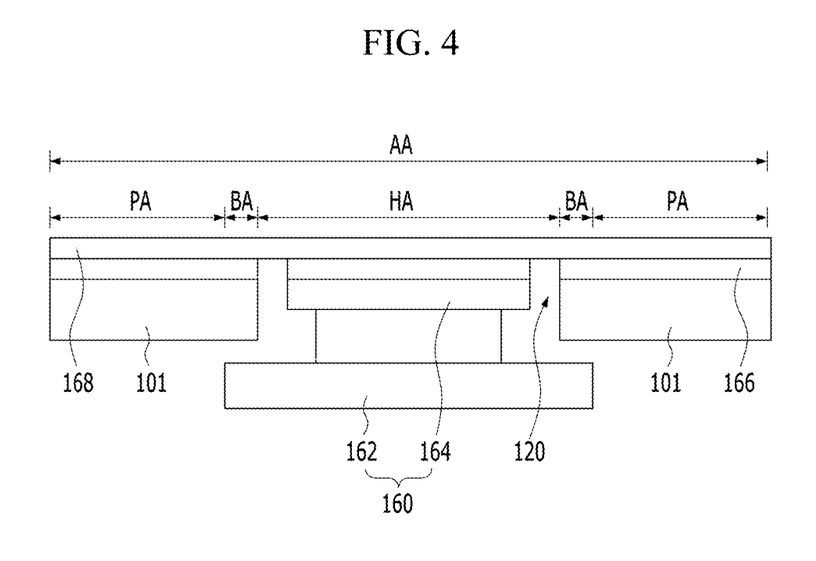
FIG. 4 is a cross-sectional view illustrating a camera module fitted in a second substrate hole illustrated in FIG. 2.

An electronic component including a camera, a speaker, a flash light source or a biometric sensor such as a fingerprint sensor is disposed in the hole area HA. The following description will be given in conjunction with an example in which a camera module 160 is disposed in the hole area HA, as illustrated in FIG. 4.

The camera module 160 includes a camera lens 164 and a camera driver 162.

The camera driver 162 is disposed at a lower surface of the substrate 101, which is included in a display panel, such that the camera driver 162 is connected to the camera lens 164.

The camera lens 164 is disposed within the second through hole 120, which extends from a lower thin film layer (for example, the substrate 101 or a back plate) disposed at a lowermost position of the active area AA to an upper thin film layer (for example, a polarization plate 166) disposed at an uppermost position of the active area AA. Accordingly, the camera lens 164 is disposed to face a cover glass 168. In this case, the second through hole 120 is disposed to overlap with the first through hole 170 while having a smaller width than the first through hole 170. The second through hole 120 may be disposed to pass through the substrate 101, the inorganic cover layer 114 and the polarization plate 166, or may be disposed to pass through the substrate 101 and the polarization plate 166.

As the camera module 160 is disposed within the active area AA, it may be possible to minimize the bezel area, which is a non-display area of the display device.

FIGS. 5A to 5E are cross-sectional views explaining a method for manufacturing an organic light emitting display device according to a first embodiment of the present disclosure, that is, the organic light emitting display device illustrated in FIG. 2.

Figure 5A:
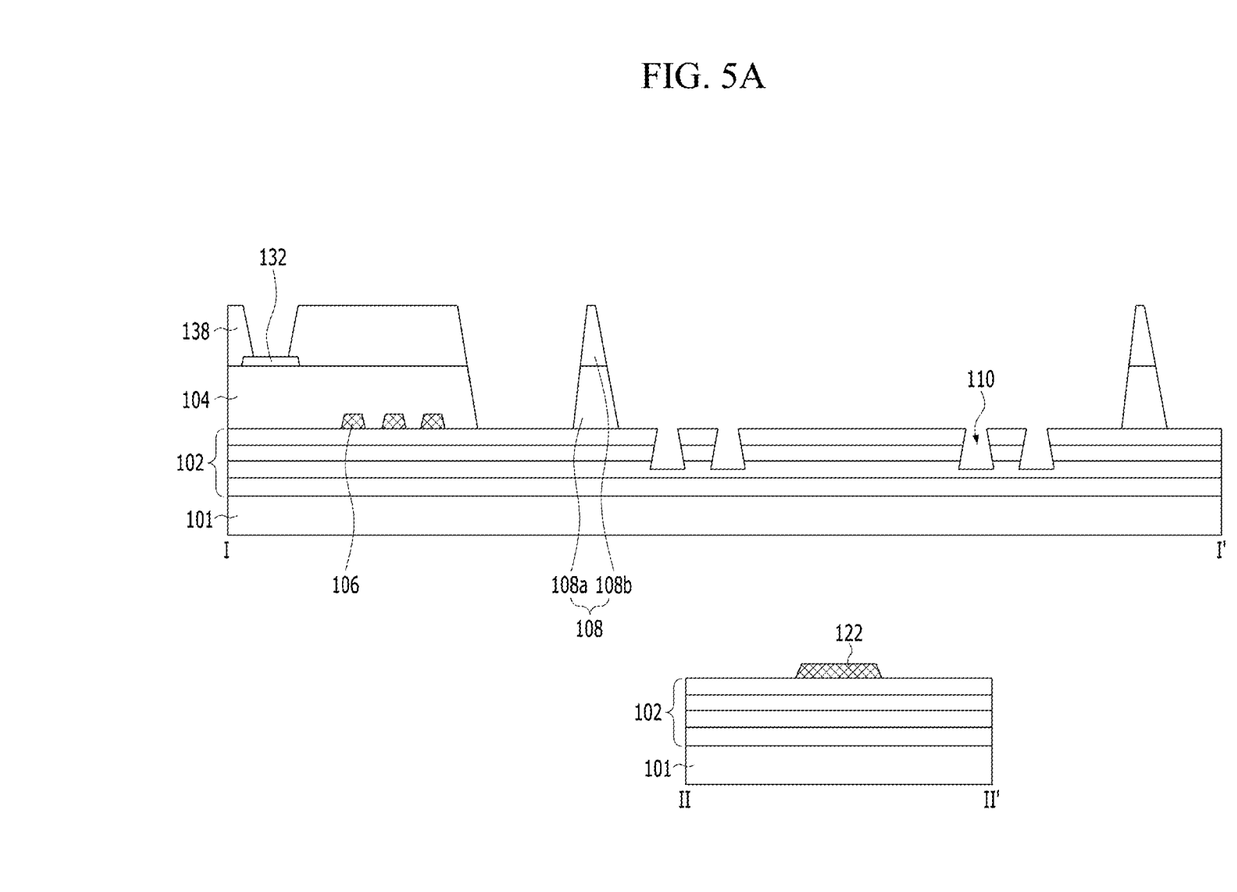
FIGS. 5A to 5E are cross-sectional views explaining a method for manufacturing the organic light emitting display device illustrated in FIG. 2.

In detail, the multi-buffer layer and the active buffer layer included in the organic insulating layer 102 are formed on the substrate 101, as illustrated in FIG. 5A. Here, the substrate 101 is made of a plastic material having flexibility, to be bendable. For example, the substrate 101 is made of polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer (COC). The multi-buffer layer may be formed over the entirety of the substrate 101. The multi-buffer layer may provide an environment capable of more stably realizing thin film formation while enabling more effective execution of various processes before execution of a main display panel fabrication process. The multi-buffer layer may include one of a first layer including $SiO_2$ and a second layer including $SiN_x$, or may be formed to have a structure in which the first layer and the second layer are sequentially laminated in this order or reverse order. The active buffer layer is an inorganic insulating layer enabling more stable formation of an active layer of thin film transistors (not shown), and may include $SiO_2$.

Thereafter, the active layer is formed on the active buffer layer through a photolithography process and an etching process. The gate insulating film, which is included in the inorganic insulating layer 102, is then formed over the active layer. The gate electrode is then formed on the gate insulating film through a photolithography process and an etching process. Subsequently, the interlayer insulating film, which is included in the inorganic insulating layer 102 is formed. The interlayer insulating film is then patterned through a photolithography process and an etching process, thereby forming source and drain contact holes (not shown), through which the active layer is exposed. Thereafter, the interlayer insulating film, the gate insulating film and the active buffer layer are patterned through a photolithography process and an etching process, thereby forming the blocking groove 110, through which the upper surface of the multi-buffer layer is exposed. At this time, a portion of the multi-buffer layer may also be patterned in accordance with the etching process and, as such, a side surface of the multi-buffer layer may be exposed through the blocking groove 110.

Subsequently, the source and drain electrodes (not shown), the signal lines 106 and the pad electrodes 112 are formed through a photolithography process and an etching process. The planarization layer 104 and the anode 132 are then sequentially formed through a photolithography process and an etching process. Subsequently, the bank 138, the inner dam 108 and the outer dam 128 are concurrently formed through a photolithography process and an etching process using the same mask.

Figure 5B:
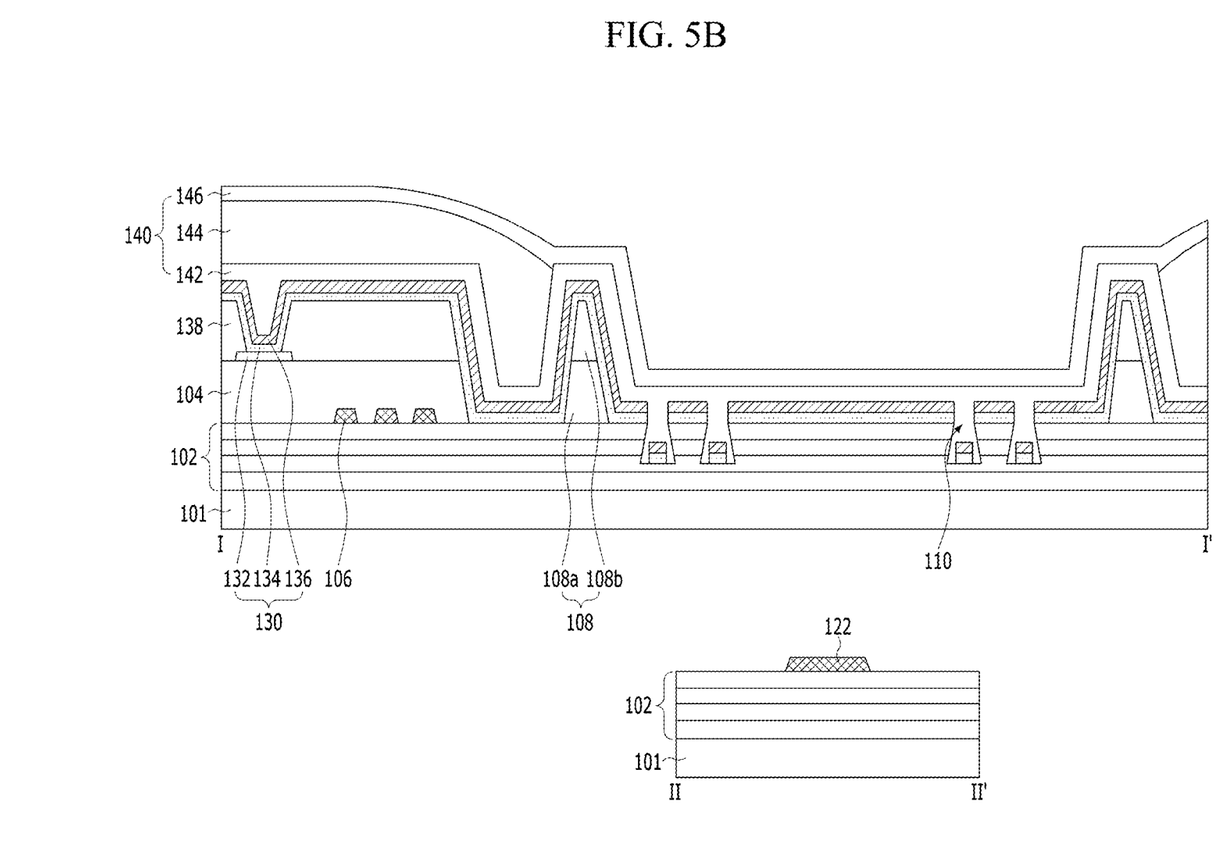

Thereafter, the organic light emitting layer 134 and the cathode 136 are sequentially formed on the substrate 101 formed with the bank 138 through a deposition process using a shadow mask, as illustrated in FIG. 5B. In this case, the light emitting stack 134 and the cathode 136 are disconnected without having continuance by the blocking groove 110. Next, at least one inorganic encapsulation layer (the inorganic encapsulation layers 142 and 146 in the illustrated case) and at least one organic encapsulation layer (the organic encapsulation layer 144 in the illustrated case) are laminated over the cathode 136, thereby forming the encapsulation unit 140. In this case, the organic encapsulation layer 144 is formed in an area, except for the hole area HA and the pad area PDA, by virtue of the inner dam 108 and the outer dam 118.

Figure 5C:
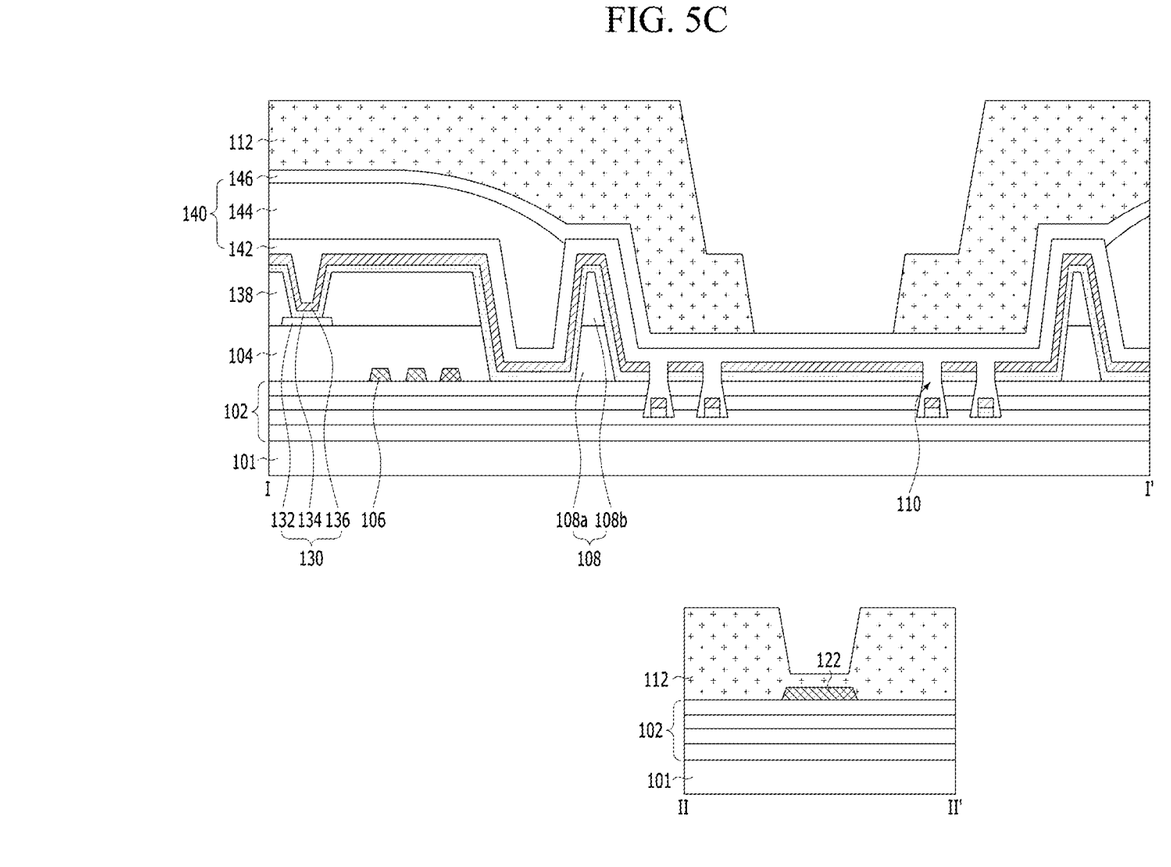

Thereafter, a photosensitive inorganic insulating material is coated over the entire upper surface of the substrate 101 formed with the encapsulation unit 140. The coated photosensitive inorganic insulating material is then patterned through a photolithography process using a halftone mask, thereby forming the organic cover layer 112, as illustrated in FIG. 5C. In this case, the organic cover layer 112 is formed not to cover a portion of the uppermost inorganic encapsulation layer 145 disposed in the hole area HA such that the portion is exposed, while covering upper surfaces of the pad electrodes 122.

Figure 5D:
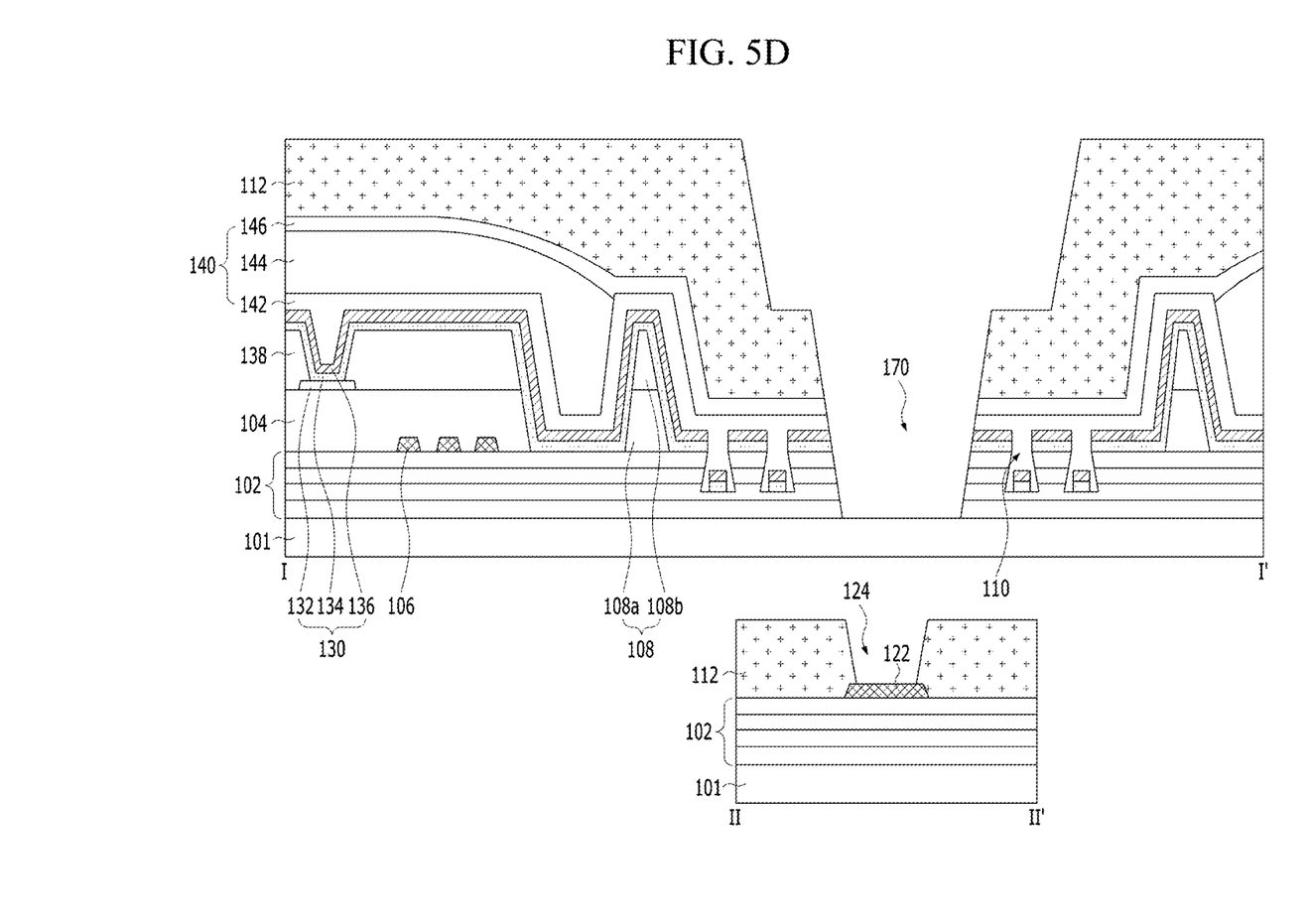

Thereafter, portions of the inorganic encapsulation layers 142 and 146, the cathode 136, the light emitting stack 134 and the inorganic insulating film 102 disposed on the substrate 101 are removed through a dry etching process using the organic cover layer 112 as a mask, thereby forming the first through hole 170, as illustrated in FIG. 5D. In this case, the first through hole 170 is patterned through the dry etching process using the organic cover layer 112 as a mask and, as such, a separate photoresist pattern is unnecessary. In this regard, a stripping process for removal of such a photoresist pattern is unnecessary. Furthermore, it may be possible to prevent penetration of moisture into interfaces among the plural thin films 112, 142, 146, 136, 134 and 102 caused by a stripping solution used in a stripping process.

Thereafter, the pad contact holes 124 are formed by removing portions of the organic cover layer 112 disposed on the pad electrodes 112 through an ashing process.

Meanwhile, although the case in which the pad contact holes 124 and the first through hole 170 are concurrently formed through a single mask process using a halftone mask has been illustratively described, each pad contact hole 124 and the first through hole 170 may be formed through separate mask processes, respectively.

Figure 5E:
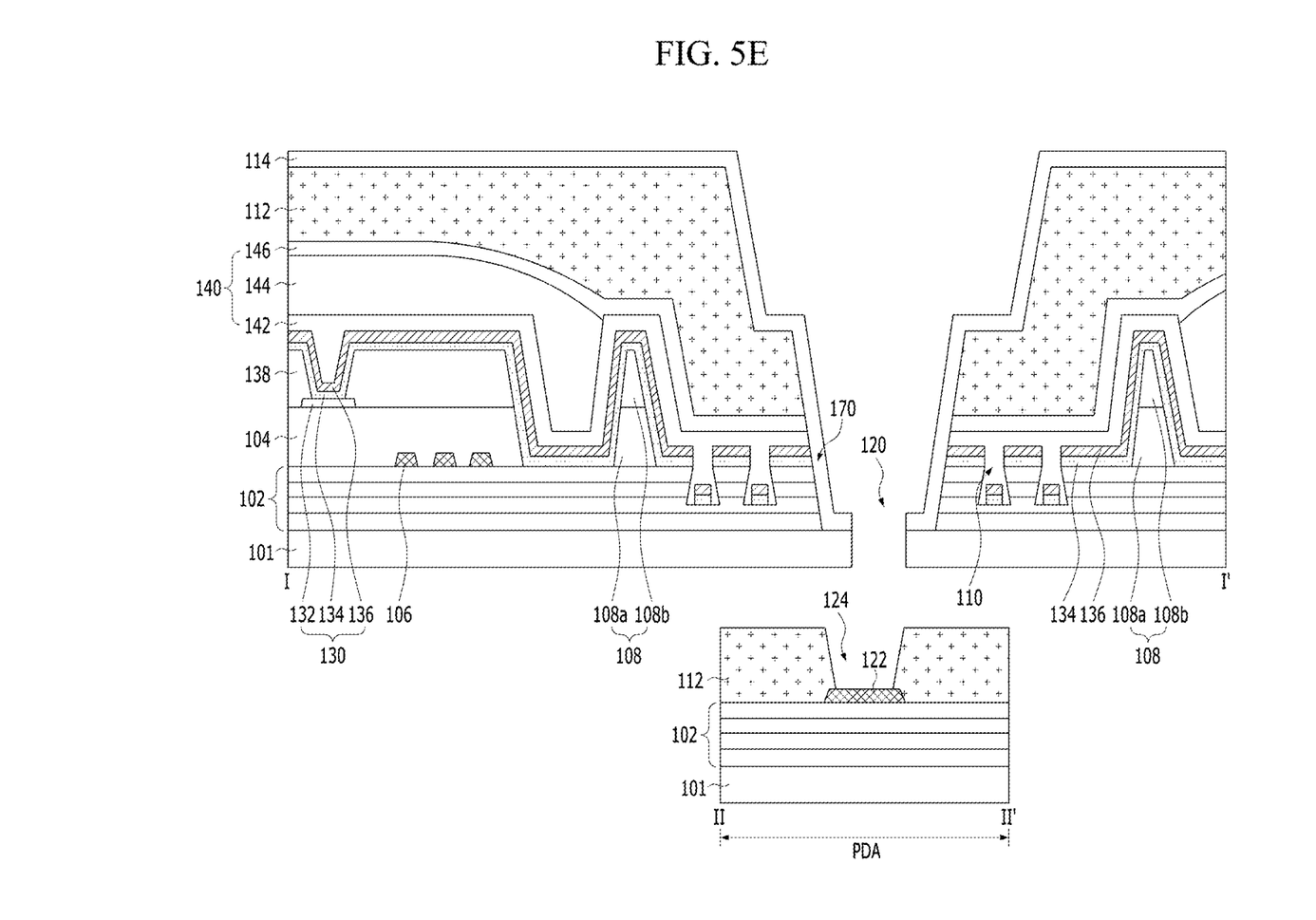

Subsequently, an inorganic insulating material is deposited over the entire upper surface of the substrate 101 formed with the pad contact holes 124 and the first through hole 170, thereby forming the inorganic cover layer 114, as illustrated in FIG. 5E. The substrate 101, the inorganic cover layer 114 and the polarization film designated by reference numeral "166" in FIG. 4 are patterned through a laser trimming process, thereby forming the second through hole 120.

As apparent from the above description, in the present disclosure, the first through hole 170 for preventing continuance of the light emitting stack 134 is formed through a dry etching process using the organic cover layer 112 made of a material not requiring a stripping process as a mask. Accordingly, it may be possible to prevent damage to the light emitting stack 134 caused by a stripping process.

In addition, the second through hole 120 is formed by removing a desired portion of the substrate 101 through a laser trimming process after formation of the first through hole 170 achieved in accordance with removal of the portions of the plural thin film layers disposed in the hole area HA through a dry etching process. Accordingly, portions of the thin films to be removed through the laser trimming process may be minimized and, as such, physical impact generated during the laser trimming process may be minimized.

Figure 6:
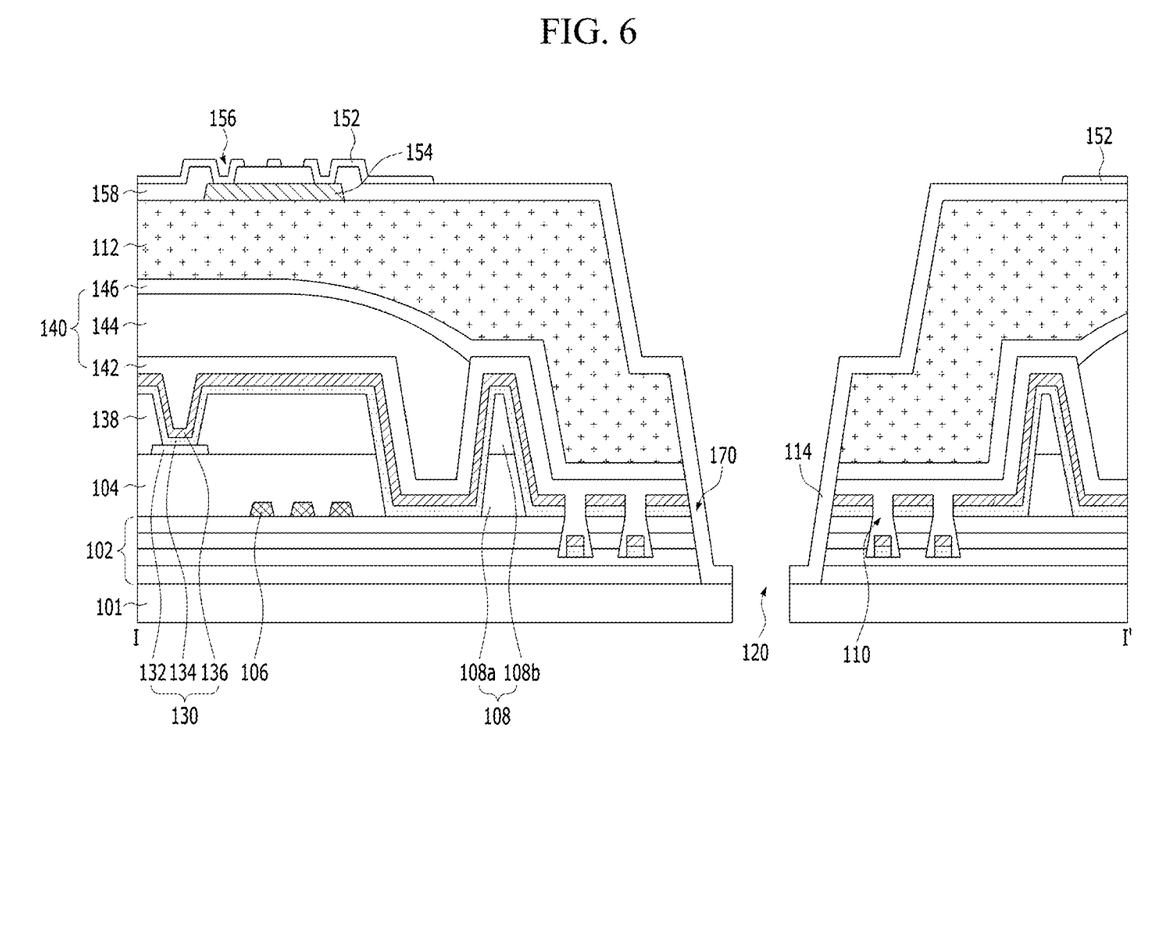
FIG. 6 is a cross-sectional view illustrating an organic light emitting display device according to another embodiment of the present disclosure.

FIG. 6 is a cross-sectional view illustrating an organic light emitting display device according to a second embodiment of the present disclosure.

The organic light emitting display device illustrated in FIG. 6 includes the same constituent elements as those of the organic light emitting display device illustrated in FIG. 2, except that a touch sensor is further included. Accordingly, no detailed description will be given of the same constituent elements.

The touch sensor includes a plurality of touch electrodes 152, and a plurality of bridges 154 connecting the touch electrodes 152.

The touch electrodes 152 may be constituted by a transparent conductive film made of ITO or IZO, may be constituted by a mesh metal film having a mesh structure, or may be constituted by a transparent conductive film as described above and a mesh metal film disposed over or beneath the transparent conductive film. Here, the mesh metal film is formed to have a mesh structure, using at least one conductive layer made of Ti, Al, Mo, MoTi, Cu, Ta or ITO while exhibiting better conductivity than the transparent conductive film. For example, the mesh metal film may be formed to have a triple-layer structure of Ti/Al/Ti, MoTi/Cu/MoTi, or Ti/Al/Mo.

One of each bridge 154 and each touch electrode 152 is disposed on the organic cover layer 112, whereas the other of each bridge 154 and each touch electrode 152 is disposed on a touch insulating film 158. That is, although each touch electrode 152 and each bridge 154 illustrated in FIG. 6 have been described in conjunction with the case in which each touch electrode 152 is disposed on the touch insulating film 158, and each bridge 154 is disposed on the organic cover layer 112, each bridge 154 may be disposed on the touch insulating film 158, and each touch electrode 152 may be disposed on the organic cover layer 112.

The touch insulating film 158 includes touch contact holes 156 each electrically connecting corresponding ones of the bridges 154 and the touch electrodes 152. The touch insulating film 158 is made of the same material as the inorganic cover layer 114, to be integrated with the inorganic cover layer 114. Upon formation of the touch contact holes 156 passing or extending through the touch insulating film 158, the portion of the inorganic cover layer 114 disposed in the hole area HA may also be removed. As such, the second through hole 120 is formed during execution of a laser trimming process such that the second through hole 120 passes through the substrate 101 and the polarization plate 166. In this case, it may be possible to prevent generation of cracks in the inorganic cover layer 114 caused by physical impact generated during execution of the laser trimming process or propagation of the generated cracks into the pixel areas PA.

Figure 7:
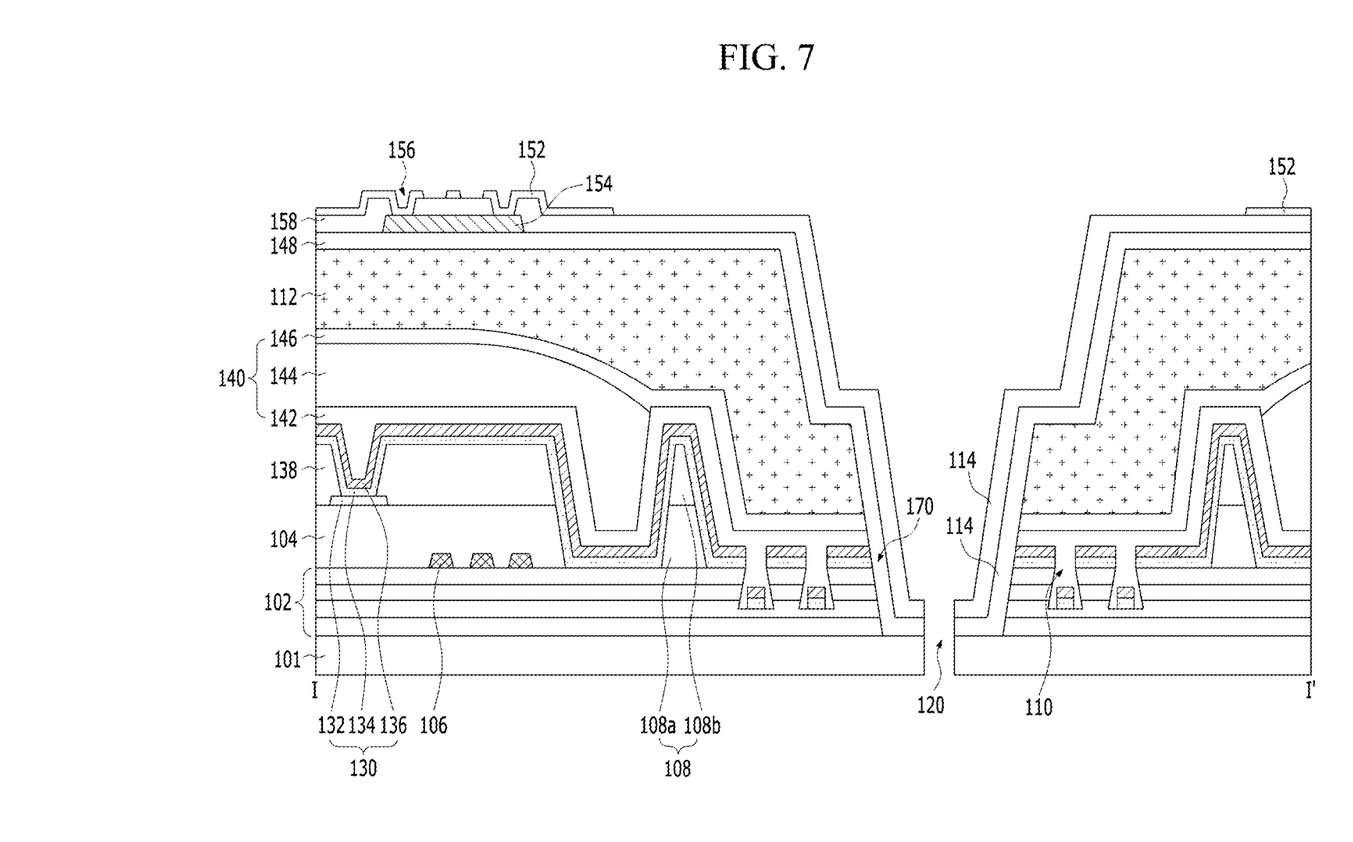
FIG. 7 is a cross-sectional view illustrating another embodiment of an inorganic cover layer illustrated in FIG. 6.

In addition, at least one of the touch buffer film 148 and the touch insulating film 158 disposed beneath the touch sensor (152 and 154) may be made of the same material as the inorganic cover layer 114, to be integrated with the inorganic cover layer 114, as illustrated in FIG. 7. In this case, the inorganic cover layer 114 may be formed to have a multilayer structure.

As apparent from the above description, the various embodiments of the present disclosure provides the following effects.

As the through hole, in which a camera module is fitted, is disposed within the active area, it may be possible to minimize the bezel area, which is a non-display area of the display device.

In addition, the through hole, which prevents continuance of the light emitting stack, is formed through an etching process using an organic cover layer made of a material not requiring a stripping process as a mask. Accordingly, it may be possible to prevent damage to the light emitting stack caused by a stripping process.

It will be apparent to those skilled in the art that various modifications and variations can be made to the various embodiments of the present disclosure without departing from the spirit or scope of the present disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
   a substrate including an active area and at least one hole area within the active area;
   a light emitting element disposed on the substrate;
   an organic cover layer disposed on the light emitting element;
   a plurality of thin film layers between the substrate and the organic cover layer;
   a first through hole extending through the plurality of thin film layers; and
   a second through hole extending through the substrate, the second through hole overlapping the first through hole,
   wherein the organic cover layer extends to a side surface of the first through hole, and
   wherein the first through hole includes a width that decreases as it approaches the second through hole.

2. The display device according to claim 1, further comprising:
   an inorganic cover layer on the organic cover layer and on side surfaces of the plurality of thin film layers that are exposed by the first through hole,
   wherein the second through hole extends through the substrate and the inorganic cover layer.

3. The display device according to claim 1, further comprising:
   a plurality of inorganic insulating layers on the substrate;
   a plurality of thin film transistors on the plurality of inorganic insulating layers in the active area, the plurality of thin film transistors being electrically connected to the light emitting element; and
   an encapsulation unit on the light emitting element, the encapsulation unit including an inorganic encapsulation layer and an organic encapsulation layer.

4. The display device according to claim 3, wherein the plurality of thin film layers includes a light emitting stack of the light emitting element, a cathode of the light emitting element, at least one of the plurality of inorganic insulating layers, or the inorganic encapsulation layer.

5. The display device according to claim 4, wherein the organic cover layer is on an upper surface of the inorganic encapsulation layer.

6. The display device according to claim 1, wherein the first through hole has a greater width than a width of the second through hole.

7. The display device according to claim 1, further comprising:
a pad electrode in a non-display area of the substrate; and
a pad contact hole extending through a portion of the organic cover layer disposed on the pad electrode, to expose the pad electrode.

8. The display device according to claim 1, further comprising:
a camera module within the second through hole.

9. The display device according to claim 1, wherein the organic cover layer includes a photosensitive organic material.

10. A display device comprising:
a substrate including an active area and at least one hole area within the active area;
a light emitting element disposed on the substrate;
an organic cover layer disposed on the light emitting element;
a plurality of thin film layers between the substrate and the organic cover layer;
a first through hole extending through the plurality of thin film layers;
a second through hole extending through the substrate, the second through hole overlapping the first through hole;
a plurality of inorganic insulating layers on the substrate;
a plurality of thin film transistors on the plurality of inorganic insulating layers in the active area, the plurality of thin film transistors being electrically connected to the light emitting element;
an encapsulation unit on the light emitting element, the encapsulation unit including an inorganic encapsulation layer and an organic encapsulation layer;
a plurality of inner dams disposed between the hole area and the light emitting element; and
a blocking groove disposed between each of the plurality of inner dams and the first through hole, the blocking groove extending through at least one of the plurality of inorganic insulating layers,
wherein the organic cover layer extends to a side surface of the first through hole, and
wherein the organic cover layer overlaps with each of the plurality of inner dams and the blocking groove.

11. A display device comprising:
a substrate including an active area and at least one hole area within the active area;
a light emitting element disposed on the substrate;
an organic cover layer disposed on the light emitting element and extending to a side surface of the at least one hole area;
a plurality of thin film layers between the substrate and the organic cover layer;
a first through hole extending through the plurality of thin film layers, the first through hole including a first opening having a first width and a second opening having a second width;
a second through hole extending through the substrate, the second through hole overlapping the first through hole;
a plurality of inorganic insulating layers on the substrate;
a plurality of thin film transistors on the plurality of inorganic insulating layers in the active area, the plurality of thin film transistors being electrically connected to the light emitting element; and
an encapsulation unit on the light emitting element, the encapsulation unit including an inorganic encapsulation layer and an organic encapsulation layer,
wherein the plurality of thin film layers includes a light emitting stack of the light emitting element, a cathode of the light emitting element, and at least one of the plurality of inorganic insulating layers,
wherein the organic cover layer is on an upper surface of the inorganic encapsulation layer,
wherein the second opening of the first through hole is between the first opening of the first through hole and the second through hole,
wherein the first width of the first opening gradually decreases towards the second opening, and
wherein the second width of the second opening gradually decreases towards the second through hole.

12. A display device comprising:
a substrate including an active area and at least one hole area within the active area;
a light emitting element disposed on the substrate;
an organic cover layer disposed on the light emitting element and extending to a side surface of the at least one hole area;
a plurality of thin film layers between the substrate and the organic cover layer;
a first through hole extending through the plurality of thin film layers;
a second through hole extending through the substrate, the second through hole overlapping the first through hole;
a plurality of inorganic insulating layers on the substrate;
a plurality of thin film transistors on the plurality of inorganic insulating layers in the active area, the plurality of thin film transistors being electrically connected to the light emitting element;
an encapsulation unit on the light emitting element, the encapsulation unit including an inorganic encapsulation layer and an organic encapsulation layer;
a plurality of inner dams disposed between the hole area and the light emitting element; and
a blocking groove disposed between each of the plurality of inner dams and the first through hole, the blocking groove extending through at least one of the plurality of inorganic insulating layers,
wherein the organic cover layer overlaps with each of the plurality of inner dams and the blocking groove.

13. A display device comprising:
a substrate including an active area and at least one hole area within the active area;
a light emitting element disposed on the substrate;
an organic cover layer disposed on the light emitting element;
a plurality of thin film layers between the substrate and the organic cover layer;
a first through hole extending through the plurality of thin film layers, the first through hole including a step; and
a second through hole extending through the substrate, the second through hole overlapping the first through hole,
wherein the organic cover layer extends to a side surface of the first through hole, wherein the step is positioned between a first section and a second section of the first through hole, the second section being between the first section of the first through hole and the second through hole, wherein a width of the first section of the first through hole gradually decreases as it approaches the step, wherein a width at the step is less than or equal to a smallest width of the first section, and wherein a width of the second section of the first through hole is less than the width of the step and gradually decreases as it approaches the second through hole.

* * * * *